United States Patent
Lee et al.

(10) Patent No.: US 7,530,003 B2
(45) Date of Patent: May 5, 2009

(54) PERMUTING MTR CODE WITH ECC WITHOUT NEED FOR SECOND MTR CODE

(75) Inventors: Yuan Xing Lee, San Jose, CA (US); Morishi Izumita, Tokyo (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 591 days.

(21) Appl. No.: 11/061,063

(22) Filed: Feb. 17, 2005

(65) Prior Publication Data

US 2006/0195760 A1    Aug. 31, 2006

(51) Int. Cl.
*G11C 29/00* (2006.01)

(52) U.S. Cl. .................. 714/759; 714/758; 714/801; 714/702; 714/747; 714/770

(58) Field of Classification Search .............. 714/770, 714/755, 763, 758, 801
See application file for complete search history.

(56) References Cited

U.S. PATENT DOCUMENTS

| | | | |
|---|---|---|---|
| 6,018,304 A | 1/2000 | Bessios | |
| 6,241,778 B1 * | 6/2001 | de Lind van Wijngaarden et al. | 341/58 |
| 6,417,788 B1 | 7/2002 | McEwen et al. | |
| 6,643,814 B1 * | 11/2003 | Cideciyan et al. | 714/755 |
| 7,031,090 B2 * | 4/2006 | Ichihara et al. | 360/65 |
| 7,126,502 B2 * | 10/2006 | Blaum et al. | 341/58 |

* cited by examiner

*Primary Examiner*—Esaw T Abraham
*Assistant Examiner*—Fritz Alphonse
(74) *Attorney, Agent, or Firm*—Townsend and Townsend and Crew LLP; Patrick Duncan (57) ABSTRACT

Embodiments of the present invention provide techniques for generating MTR codes with ECC without the use of a second MTR code, while still satisfying the specified constraint. In one embodiment, a system for processing data comprises a maximum transition run or timing-varying maximum transition run (hereinafter MTR) encoder configured to encode input data sequence from a hard disk controller into an MTR coded sequence which satisfies a j-constraint; an error correction code (ECC) encoder configured to generate ECC check bits for the MTR coded sequence; and a bit-level interleaving and substitution module configured to interleave the generated ECC check bits into the MTR coded sequence by stuffing the generated ECC check bits at boundaries of MTR coded blocks of the MTR coded sequence, to determine if a violation of the j-constraint has occurred at the boundaries of the MTR coded blocks, and to perform substitution of bits at a boundary of the MTR coded blocks to maintain the j-constraint if a violation of the j-constraint has occurred.

27 Claims, 6 Drawing Sheets

| | Original Sequence | | | | | | | | | Substitution Table | | | | | | | | | |
|---|---|---|---|---|---|---|---|---|---|---|---|---|---|---|---|---|---|---|---|
| | | | | | | | | | | | No substitution | | | | | | | | |
| 601 | x | x | 0 | 1 | bi | bj | 1 | 0 | y | y | | 0 | 1 | 1 | 0 | 1 | 1 | 1 | 0 | y |
| 602 | x | 0 | 1 | 1 | bi | bj | 1 | 1 | 0 | y | | x | x | 0 | 1 | 1 | 1 | 1 | 0 | 0 |
| 603 | x | x | 0 | 1 | bi | bj | 1 | 1 | 0 | y | | 0 | 1 | y | 0 | 1 | 1 | 1 | 1 | 0 |
| 604 | x | 0 | 1 | 1 | bi | bj | 1 | 0 | y | y | | 0 | x | 0 | x | 1 | 0 | 1 | y | y |

611 612 613 614

PERMUTING MTR CODE WITH ECC WITHOUT NEED FOR SECOND MTR CODE

CROSS-REFERENCES TO RELATED APPLICATIONS

Not Applicable

BACKGROUND OF THE INVENTION

The present invention relates to techniques for generating modulation codes and, more particularly, to techniques for permuting MTR (maximum transition run) codes with ECC (error correction code) without the use of a second MTR code.

A disk drive can write data bits onto a data storage disk such as a magnetic hard disk. The disk drive can also read data bits that have been stored on a data disk. Certain data patterns are difficult to write onto a disk and often cause errors when the data patterns are read back. Long sequences of consecutive zeros or consecutive ones (e.g., 40 consecutive zeros) are examples of data patterns that are prone to errors. A long sequence of alternating polarity bits (010101010 . . . ) is another example of an error prone data pattern.

It is desirable to eliminate error prone patterns in user input data. Eliminating error prone patterns ensures reliable operation of the detector and timing loops in a disk drive system. One way to eliminate error prone data patterns is to substitute these data patterns with data patterns that are less likely to cause errors. The substitute symbols can be stored in memory in lookup tables. Lookup tables, however, are undesirable for performing substitutions of data patterns with a large number of bits, because they require a large amount of memory.

Many disk drives have a modulation encoder that uses modulation codes to eliminate error prone data patterns. Modulation encoders impose global and/or interleaved constraints on data to eliminate certain data patterns. A global constraint prohibits data patterns with more than a certain number of consecutive zeros or ones. An interleaved constraint prohibits data patterns with more than a certain number of alternating zeros or ones.

Modulation codes, also known as constrained codes, have been widely used in magnetic and optical data storage to eliminate sequences that are undesired for the processes of recording and reproducing digital data. Various classes of modulation codes are used in practice. For example, peak detection systems employing run length-limited RLL(d,k) constrained codes, such as rate-½ RLL(2,7) and rate-⅔ RLL (1,7) codes, have been predominant in digital magnetic storage at low normalized linear densities.

At moderate normalized linear densities, the introduction of partial-response maximum-likelihood (PRML) detection channels into data storage required a different type of constrained codes. This class of codes, which are known as PRML(G,I) codes, facilitates timing recovery and gain control, and limits the path memory length of the sequence detector, and therefore the decoding delay, without significantly degrading detector performance. PRML(G,I) codes are used in conjunction with $1/(1+D^2)$ precoders and noise-predictive maximum likelihood (NPML) channels, which generalize the PRML concept.

More recently, maximum transition run (MTR) codes, in particular MTR(j,k) and MTR(j,k,t) codes, have been introduced to provide coding gain for noise-predictive maximum likelihood channels. MTR codes, which are used in conjunction with 1/(1+D) precoders, improve detector performance by eliminating or reducing the occurrence of dominant error events at the output of the sequence detector at the expense of increasing the baud rate and incorporating the j-constraint into the detector. Likewise, time-varying maximum transition run codes (TMTR) used in practice employ the same techniques as MTR codes, with the further distinction that odd and even bits of data have different constraints by implementing a time-varying trellis.

Disk drives typically have error correction encoders. A Reed-Solomon (RS) encoder is one type of error correction encoder. An RS encoder generates error correction code (ECC) check bytes (including cyclic redundancy check (CRC) bytes, if any). The ECC and CRC check bytes are used to detect errors and to correct errors in the data bytes using well-known decoding processes. The RS encoder inserts ECC and CRC check bytes into the data stream before data is written onto a disk. After data is read from the disk, an RS decoder uses the ECC and CRC codes to detect and correct errors in the data.

Modulation encoding can be performed prior to RS encoding or after RS encoding. Performing modulation encoding after RS encoding is referred to as forward concatenation. In forward concatenation, data is initially RS encoded. Then the data is modulation encoded, and the modulation encoded data is written onto a disk. Data is subsequently read from the disk and demodulated. RS decoding is performed after the data is demodulated. No error correction is performed on the data between modulation encoding and demodulation. The demodulation process in forward concatenation tends to propagate errors. Efficient MTR codes intrinsically have poor error propagation due to code constructions, which prevents gains at pre-ECC to be carried over to post-ECC with the conventional forward concatenation system configuration. Permuting MTR/ECC allows the pre-ECC gains of MTR codes to be carried over after ECC since post-ECC gains are what is important to real applications.

Figure 1A:
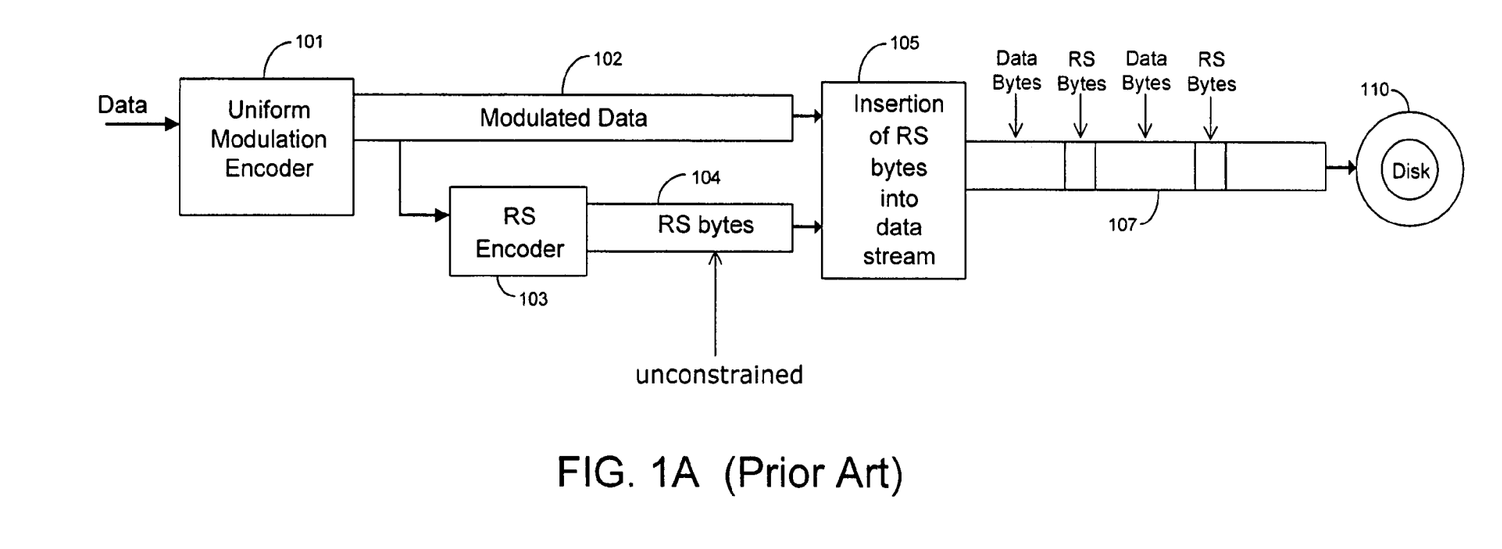
FIG. 1A illustrates a conventional reverse concatenation technique.

Performing modulation encoding prior to RS encoding is referred to as reverse concatenation. FIG. 1A illustrates a typical reverse concatenation technique. Data is initially encoded by a modulation encoder 101. Modulation encoder 101 generates data 102 that is modulated according to a predetermined constraint. For example, a global constraint may be that modulated data 102 can have no more than 10 consecutive zeros (G=10). The modulated data is then encoded by an RS encoder 103 to generate RS check bytes 104 (a byte can be 8-bit, 10-bit, or others). RS check bytes 104 are unconstrained. For example, check bytes 104 may contain more than 10 consecutive zeros.

The insertion block 105 inserts the check bytes into the modulated data stream. The combined data stream 107 is then stored on disk 110. The maximum run of consecutive 0 or 1 bits allowed in a global set of data is less than or equal to G.

Figure 1B:
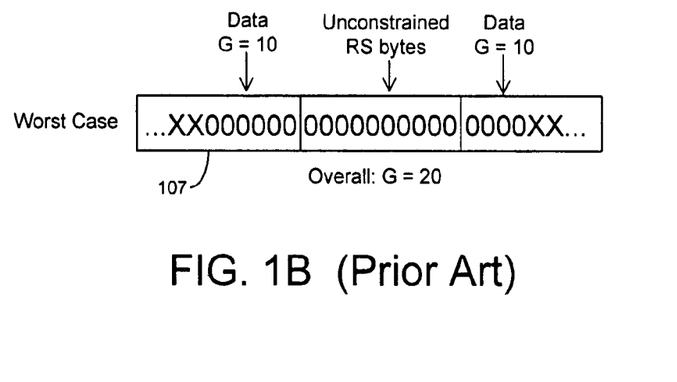
FIG. 1B illustrates an example of a worst case scenario for the reverse concatenation technique shown in FIG. 1A.

FIG. 1B illustrates an example of a worst case scenario for the reverse concatenation technique shown in FIG. 1A. For example, assume that the modulated data 102 has a constraint of G=10, and the RS check bytes are 10 bits long. Although only a maximum of 10 consecutive zeros are allowed in the modulated data 102, the combined data stream 107 may violate this constraint with a maximum of 20 consecutive zeros (G=20), as shown in FIG. 1B.

Reverse concatenation solves the problem of error propagation, because the RS decoder corrects any errors before the data is demodulated. However, the RS check bytes are not constrained by modulation encoding, because the check bytes are inserted into the data stream after modulation encoding. As a result, the check bytes may contain error prone sequences of bits, such as too many consecutive zeros. The insertion of unconstrained check bytes may significantly degrade the overall modulation constraint of a modulated data stream.

Figure 2A:
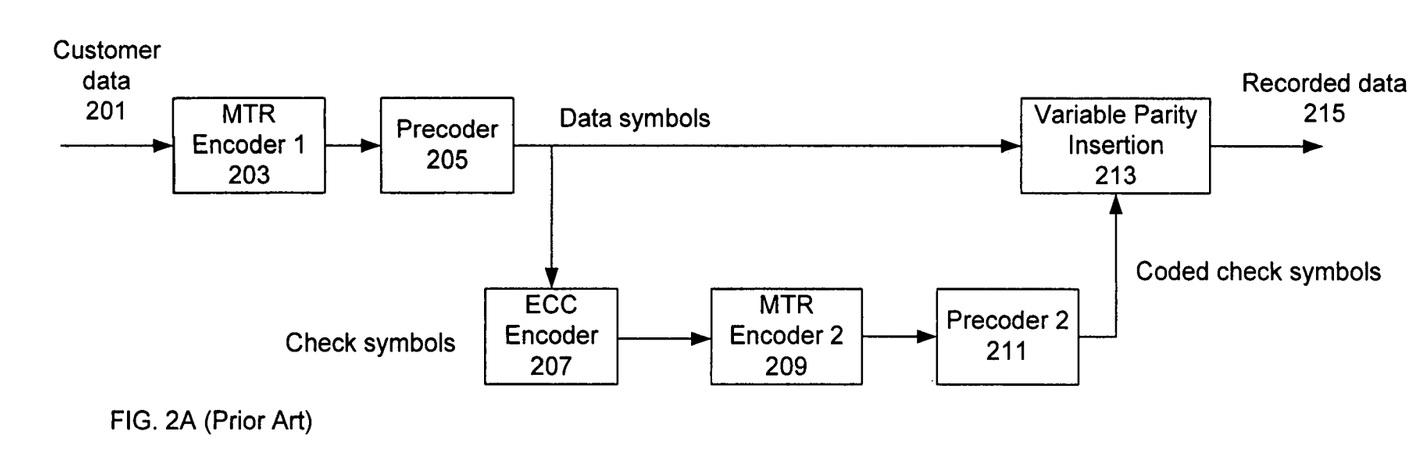
FIG. 2A illustrates a conventional reverse concatenation encoding technique with implementation of a second MTR encoder.
Figure 2B:
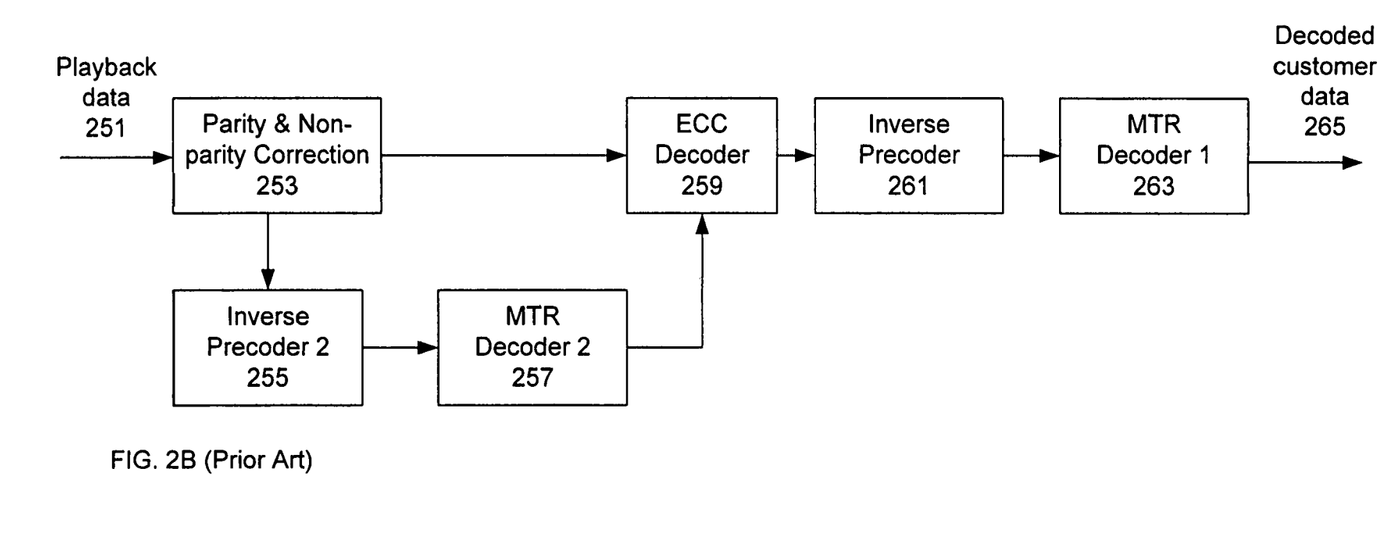
FIG. 2B illustrates a conventional reverse concatenation decoding technique with implementation of a second MTR decoder.

In alternate conventional configurations of reverse concatenation, a second MTR modulation encoder is used to ensure that the ECC check bytes also satisfy the specified constraint. FIG. 2A illustrates a conventional reverse concatenation technique with implementation of a second MTR encoder. The first MTR encoder 203 removes the strings of consecutive ones and zeros from the customer data 201 that violate a specified constraint. The precoder 205 translates the output code sequences of MTR encoder 203 into sequences of magnetic flux transitions to be written on a data track within a hard disk drive. The ECC encoder 207 produces check symbols to check that the output sequences from MTR encoder 203 are properly generated (i.e., the sequences do not contain any flipped bits, where a '1' is incorrectly written as a '0' or vice versa). The second MTR encoder 209 removes any consecutive run sequences that would violate the constraint if the ECC check symbols were to be simply inserted into the MTR encoded data, as shown in FIG. 1B. The second precoder 211 performs similar functions as the precoder 205, but on the MTR encoded data from the second MTR encoder 209. The ECC bits are added to the end of the MTR encoded data. The variable parity insertion module 213 adds extra parity bits to the end of the encoded data to keep track of the number of ones and zeros in the data stream, producing the recorded data 215. The retrieval of the original data (decoding) is shown in FIG. 2B, where a conventional reverse concatenation technique of decoding playback data 251 back to the original customer data 265 is illustrated. The parity and non-parity correction module 253 removes the extra parity bits that were added to the data to make correction based on a predefined set of error events. The inverse precoder 255 translates the sequences of magnetic flux transitions back to MTR encoded sequences. The MTR decoder 257 restores original consecutive run sequences that would have violated the constraint if the ECC check symbols were to be simply inserted into the MTR encoded data. The inverse precoder 261 performs similar functions as the inverse precoder 255. The ECC decoder 259 separates the ECC check bits from the MTR encoded data. The MTR decoder 263 converts sequences that were modulated from the MTR encoder 203 back to the original customer data 265. The use of a second MTR encoder in the reverse concatenation techniques, however, introduces potential sources of error propagation, code rate loss, and latency issues.

BRIEF SUMMARY OF THE INVENTION

Embodiments of the present invention provide techniques for generating MTR codes with ECC without the use of a second MTR code, while still satisfying the specified constraint. Instead of the second MTR, a bit-level interleaving and substitution module is provided to interleave the ECC check bits into the MTR coded data outputted from the MTR encoder and, if necessary, perform substitution of bits at the boundaries of the MTR coded words or blocks to maintain the j-constraint after the ECC check bits are embedded into the MTR coded data.

In accordance with an aspect of the present invention, a system for processing data comprises a maximum transition run or timing-varying maximum transition run (hereinafter MTR) encoder configured to encode input data sequence from a hard disk controller into an MTR coded sequence which satisfies a j-constraint; an error correction code (ECC) encoder configured to generate ECC check bits for the MTR coded sequence; and a bit-level interleaving and substitution module configured to interleave the generated ECC check bits into the MTR coded sequence by stuffing the generated ECC check bits at boundaries of MTR coded blocks of the MTR coded sequence, to determine if a violation of the j-constraint has occurred at the boundaries of the MTR coded blocks, and to perform substitution of bits at a boundary of the MTR coded blocks to maintain the j-constraint if a violation of the j-constraint has occurred at the boundary.

In some embodiments, the bit-level interleaving and substitution module is configured to determine a number of ECC check bits to be stuffed at the boundaries of the MTR coded blocks. Determining the number of ECC check bits to be stuffed may comprise calculating a ratio of the number of ECC check bits $(m_2-m_1)q$ to the number of MTR coded blocks $(k/r_2)$ as $s=(m_2-m_1)qr_2/k$, where k is a number of MTR encoded bits of the MTR coded sequence, $r_2$ is an output block length of the MTR encoder, q is a symbol size of the ECC encoder, $m_1$ is a number of information q-bit symbols, and $m_2$ is $m_1/R_2$ in which $R_2$ is a code rate of the ECC encoder; if s<1, then stuffing the ECC check bits between MTR coded blocks one bit at a time; if s>1 and s is an integer, then stuffing the ECC check bits between MTR coded blocks s bits at a time; and if s>1 and s is not an integer, then determining s' as a next integer greater than s and stuffing the ECC check bits between MTR coded blocks s' bits at a time.

In specific embodiments, the bit-level interleaving and substitution module is configured to generate a substitution table to be used to perform substitution of bits at the boundary of the MTR coded blocks. The substitution table is generated to produce substitution bits that include a flag sequence of bits to indicate that a substitution has occurred based on a property of the MTR coding of the MTR encoder. The property of the MTR coding includes a maximum number of 1s at a boundary of the MTR coded block, and the substitution bits include a flag sequence of bits exceeding the maximum of 1s at the boundary of the MTR coded block to indicate that a substitution has occurred.

In some embodiments, a parity insertion module is configured to add parity bits to the data sequence after processing by the bit-level interleaving and substitution module. The system further comprises a mechanism to add pad bits if necessary to the input data sequence based on an input block length of the MTR encoder, a mechanism to add pad bits if necessary to the MTR coded sequence based on a symbol size of the ECC encoder, and a mechanism to add pad bits to the data sequence from the bit-level interleaving and substitution module if necessary based on an input block length of the parity insertion module. The system may further include a precoder disposed between the bit-level interleaving and substitution module and the parity insertion module to translate the data sequence from the bit-level interleaving and substitution module into transitions to be recognized by a hard disk drive. The system may also include a parity and non-parity correction module configured to perform parity and non-parity correction of data from the hard disk drive; a bit-level de-interleaving and substitution module configured to restore the data from the parity and non-parity correction module to original sequences by reversing the substitution, and to remove and regroup the interleaved ECC check bits; and an MTR decoder configured to decode the data from the bit-level de-interleaving and substitution module to produce decoded data to be sent to the hard disk controller.

In accordance with another aspect of the invention, an interleaving and substitution module for interleaving error correction code (ECC) check bits into a maximum transition run or timing-varying maximum transition run (MTR) coded sequence. The interleaving and substitution module comprises an interleaving unit configured to interleave the ECC check bits into the MTR coded sequence by stuffing the ECC check bits at boundaries of MTR coded blocks of the MTR coded sequence; a violation determination unit configured to determine if a violation of a j-constraint of the MTR coded sequence has occurred at the boundaries of the MTR coded blocks; and a substitution unit configured to perform substitution of bits at a boundary of the MTR coded blocks to maintain the j-constraint if a violation of the j-constraint has occurred at the boundary.

In accordance with another aspect of the present invention, a method of processing data for a hard disk controller comprises interleaving error correction code (ECC) check bits into a maximum transition run or timing-varying maximum transition run (MTR) coded sequence by stuffing the ECC check bits at boundaries of MTR coded blocks of the MTR coded sequence; determining if a violation of a j-constraint of the MTR coded sequence has occurred at the boundaries of the MTR coded blocks; and performing substitution of bits at a boundary of the MTR coded blocks to maintain the j-constraint if a violation of the j-constraint has occurred at the boundary.

DETAILED DESCRIPTION OF THE INVENTION

Figure 3A:
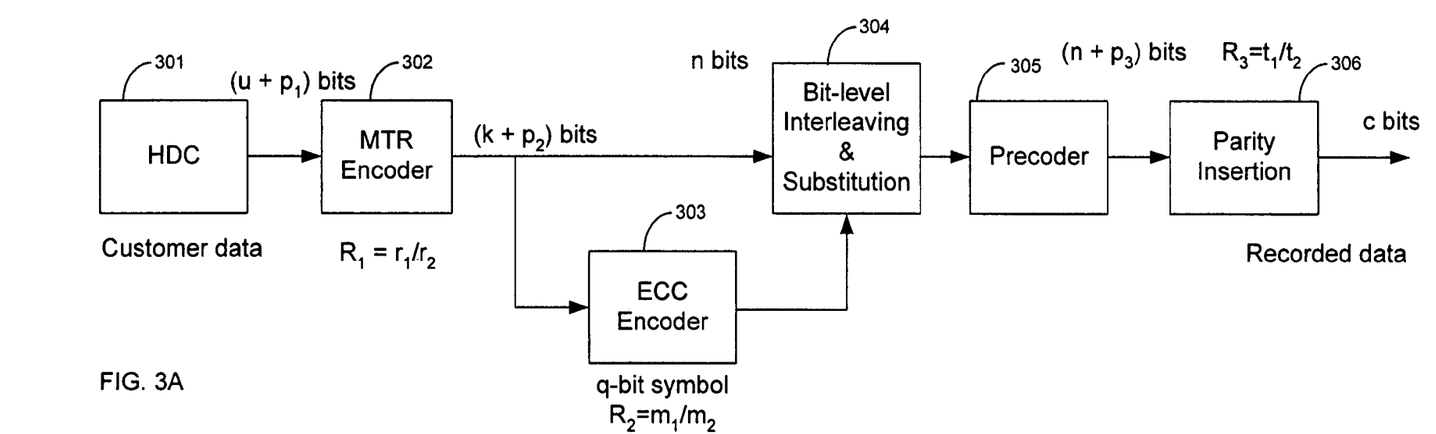
FIG. 3A is a block diagram illustrating an encoding scheme according to an embodiment of the present invention.

FIG. 3A illustrates an encoding scheme according to an embodiment of the present invention. A hard disk controller (HDC) 301 contains customer data to be encoded and written onto a hard disk drive. The customer data is sent to an MTR encoder 302, which processes the customer data and alters the data stream so that the j-constraint is satisfied (i.e., long strings of consecutive ones and zeros are removed). The j-constraint is specified to set a maximum number of transitions that may occur within a predetermined block of data. In one aspect of MTR coding, a '1' represents a transition to be represented on a hard disk drive, while a '0' represents no transitions. Thus, a j-constraint of j=4 means that a maximum of four consecutive ones are allowed in a data sequence. An MTR encoder contains a code rate which represents the ratio of block of input bits processed per output bits encoded. For example, a 20/21 MTR encoder takes in 20 bits at a time and outputs 21 encoded bits. The MTR encoder 302 shown in FIG. 3A has a code rate $R_1 = r_1/r_2$.

The output data from the MTR encoder 302 is then sent to an ECC encoder 303, where ECC check bits are generated. There are several examples of ECC encoders that currently exist. A Reed-Solomon (RS) encoder is one example of an ECC encoder. An RS encoder generates error correction code (ECC) check bytes that are used to detect errors and to correct errors in the data bytes using well-known decoding processes. The generated ECC bytes may also be referred to as ECC symbols that consist of q-bits. For example, an ECC encoder that has 10 ECC check bits would have q=10. The ECC encoder 303 has a code rate $R_2 = m_1/m_2$, where $m_1$ is the number of information q-bit symbols at the input and $m_2$ is the number of at the output.

After implementing the ECC encoder, the MTR encoded data and ECC check bits then are combined in the bit-level interleaving and substitution module 304. In this module 304, the ECC check bits generated from the ECC encoder 303 are inserted into the MTR coded data outputted from the MTR encoder 302. In addition, a substitution table may be implemented in order to maintain the j-constraint after the ECC check bits are embedded into the MTR coded data. This involves substitution of bits at the boundaries of the MTR coded words or blocks to ensure that the j-constraint is maintained.

In a typical system where there are 30 ECC check symbols, the sector size is 410 10-bit symbols, and the MTR encoder is a 20/21 code, there are 4305 MTR coded bits and 300 ECC check bits. The 300 ECC check bits are embedded into the 4305 MTR coded bits. One way to interleave the ECC check bits is to embed 2 ECC check bits into the boundaries between blocks of 21-bit MTR coded bits. There are four combinations of two bits (i.e., 00, 01, 10, and 11). Only one (11) may violate the j-constraint at the boundary. When this occurs, a substitution can be made to avoid violation of the j-constraint. Bit-level interleaving and substitution may be implemented by hardware circuitry, and/or through the use of a software program. An example is provided below to illustrate the interleaving and substitution process in greater detail.

After performing bit-level interleaving and substitution in the module 304, the data is processed by a precoder 305. Any suitable precoder may be used. Typically, a 1/(1+D) precoder is used to translate MTR code sequences into transitions to be recognized by a hard disk drive while maintaining the j-constraint. The precoded codewords are recorded as sequences of magnetic flux transitions within a data track defined on a storage surface of a magnetic recording disk. In some embodiments, the precoder 305 may be omitted or embedded into the MTR code design. The output of the precoder 305 is then sent to a parity insertion module 306, where parity bits are added to the data. Parity insertion involves adding additional bits to provide another method of error correction of the encoded data. The code rate in the parity insertion module 306 is $R_3 = t_1/t_2$, where $t_1$ is the input block length and $t_2$ is the output block length of the parity insertion module. The use of parity insertion module 306 in the system may be omitted in alternative embodiments. The data (in c bits) is then sent to a channel to be recorded onto a hard disk drive.

In the encoding scheme of FIG. 3A, bit padding is performed prior to the MTR encoder 302, the ECC encoder 303, and the parity insertion module 306. Pad bits are inserted into the data stream to make the customer data "fit" into each block frame to be processed effectively.

More specifically, the HDC 301 produces u customer bits including CRC bits. Prior to reaching the MTR encoder 302, $p_1$ pad bits are padded to produce $(u+p_1)$ bits which is a multiple of $r_1$ bits, where $r_1$ is the input block length of the MTR encoder 302. The MTR encoder 302 encodes input blocks of $r_1$ bits into output blocks of $r_2$ bits at the code rate of $R_1=r_1/r_2$. This produces k encoded bits from the $(u+p_1)$ bits. Next, $p_2$ pad bits are padded to produce $(k+p_2)$ bits which is a multiple of q bits, where q is the symbol size of the ECC encoder 303. It is noted, however, that the MTR codeword length does not have to be a multiple of q since there is no error propagation before ECC encoding. In the ECC encoder 303, the number of information q-bit symbols is $m_1=(k+p_2)/q$. The ECC encoder 303 generates $(m_2-m_1)$ q-bit check symbols from $m_1$ q-bit input symbols at the code rate $R_2=m_1/m_2$. The number of output bits is $n=m_2q$. Before performing parity insertion in the module 306, $p_3$ pad bits are padded to the n bits to make a multiple of $t_1$ bits. The parity insertion module 306 encodes blocks of $t_1$ bits into blocks of $t_2$ bits by adding parity check bits at the code rate of $R_3=t_1/t_2$. The parity bits may also be added in such a way that MTR constraints are met after parity bits addition using the similar techniques for insertion of ECC check bytes. The number of pad bits $p_1$, $p_2$, and $p_3$ should be selected to be as small as possible while satisfying the following conditions:

$k=(u+p_1)*r_2/r_1$, in bits $m_1=(k+p_2)/q$, in q-bit symbols $m_2=m_1/R_2$, in q-bit symbols $n=m_2q$, in bits $t_1=(n+p_3)/L$, in bits, where L is an integer $c=(n+p_3)*t_2/t_1$, in bits.

Figure 3B:
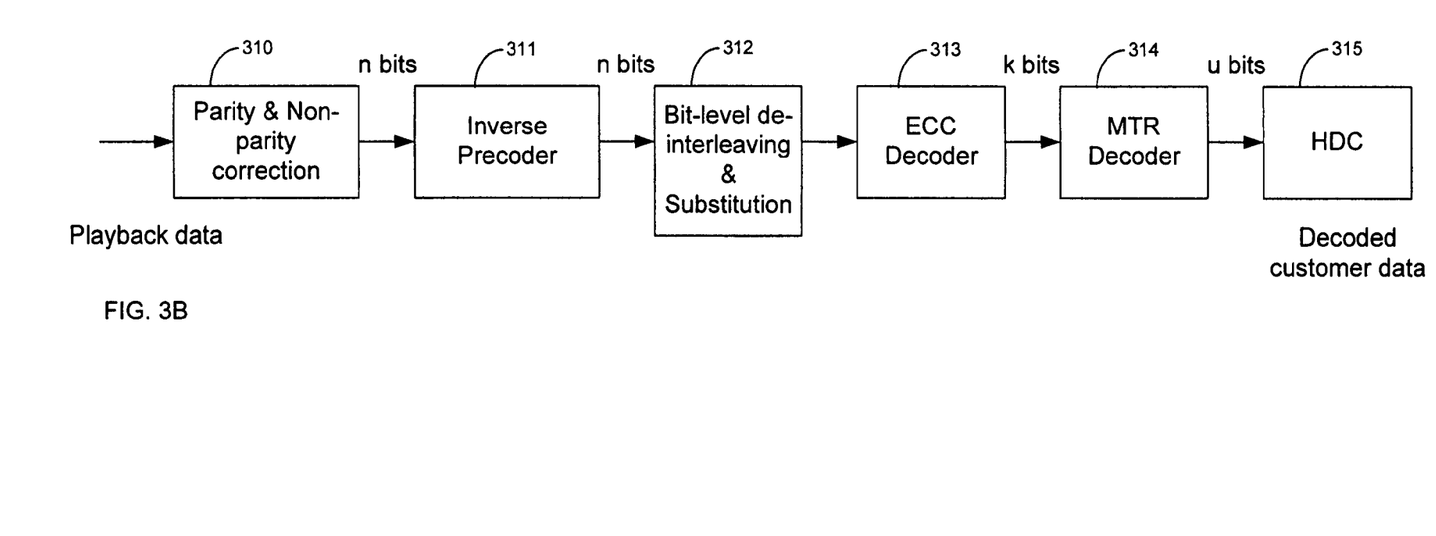
FIG. 3B is a block diagram illustrating a decoding scheme according to an embodiment of the present invention.

FIG. 3B illustrates a decoding scheme according to an embodiment of the present invention. The playback data to be decoded to the original customer data may be first processed by a parity and non-parity correction module 310, where parity and non-parity correction is executed. Then, the data is processed by an inverse precoder 311 which takes the data during playback, and converts the flux transitions which have been induced in a read head element back to MTR coded words to be further processed by a bit-level de-interleaving and substitution module 312. The module 312 restores the data to original sequences that were transformed by the substitution table, and the data is de-interleaved, where ECC check bits inserted between the MTR coded words are fetched and reorganized into ECC check bytes, and appended after the data bytes. The output of the bit-level de-interleaving and substitution module 312 is then sent through an ECC decoder 313, which processes the data bytes and ECC bytes and removes ECC bytes from the data stream. An MTR decoder 314 then decodes the data back to the original customer data. The decoding scheme further includes the removal of $p_3$ pad bits after parity correction at the parity and non-parity correction module 310 to produce n bits per block, the removal of $p_2$ pad bits after ECC decoding at the ECC decoder module 313 to produce k bits per block, and the removal of $p_1$ pad bits after MTR decoding at the MTR decoder 314 to produce u bits per block. The decoded data is sent to the HDC 315 as decoded customer data.

By eliminating the second MTR encoder, overall code rates are improved, while sources of latency and error propagation coming from the second MTR decoder are eliminated. Furthermore, bit errors may be condensed to different locations in the data stream, which may reduce symbol errors.

An example is used to illustrate the encoding scheme. The specific numbers and values used in this example are merely illustrative, and in no way limit the present invention. As shown in FIG. 3A, the HDC 301 sends u customer bits to the MTR encoder 302. Let u equal 4144 bits in this particular example. Furthermore, let MTR encoder 302 have a code rate of 20/21, so that the code rate $R_1$=20/21, $r_1$=20, and $r_2$=21. In order to allow the total amount of customer bits to fit into the 20/21 frame, padding bits may be used to break u customer bits into blocks of $r_1$ bits to be processed by MTR encoder 302. Therefore, if $p_1$ bits are used as padding bits, $p_1$ may equal 16 bits resulting in 4160 bits ($u+p_1$=4144+16=4160) to be broken into 20 bit words to be processed by MTR encoder 302. The output of MTR encoder 302 will consist of k total bits, where in this case, k=4368 (k=4160+208) because MTR encoder 302 adds 208 extra bits to the data stream. Then, the $p_2$ padding bits are added to k so that the data can fit into ECC encoder 303. In this particular example, let one ECC symbol consist of 10 ECC check bits, let $p_2$ equal 2 to make k+p2=4370, and let the code rate of ECC encoder 303 be $R_2$=437/467, so that q=10, $m_1$=437, and $m_2$=467. The total amount of ECC check bits generated is $(m_2-m_1)$ q-bit symbols, where in this example, $m_2-m_1$=467−437=30 10-bit symbols. In other words, 300 total ECC check bits are generated by the ECC encoder 303, where these 300 ECC check bits are added to the previous 4370 MTR encoded bits to produce a total of 4670 bits. The total number of bits entering the bit-interleaving and substitution module 304 is $n=m_2q$=4670 bits. Next, these n bits are interleaved and sequences may be substituted by the bit-interleaving and substitution module 304.

Figure 4:
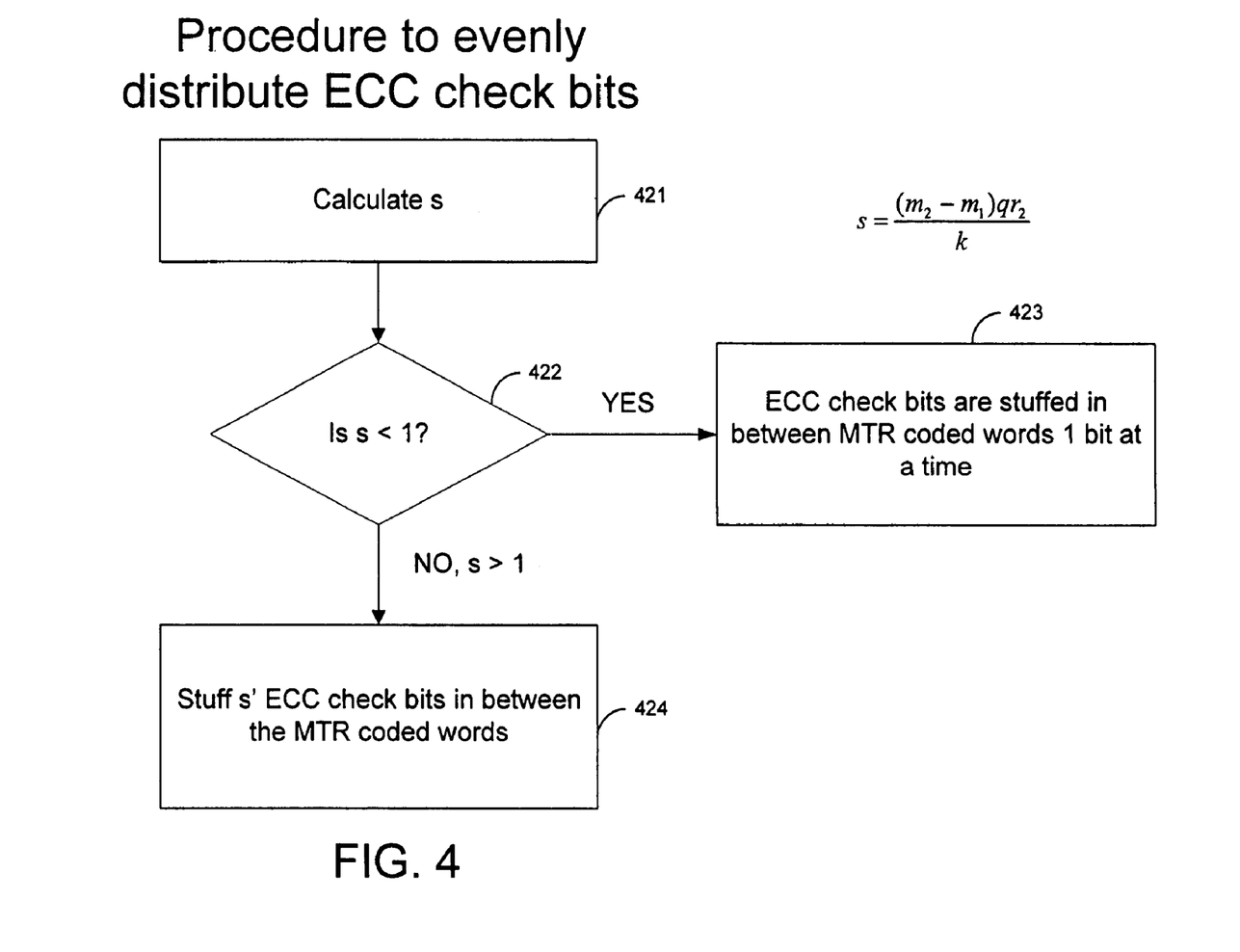
FIG. 4 is a flowchart illustrating a technique to distribute ECC check bits within MTR coded words or blocks according to an embodiment of the invention.

FIG. 4 illustrates a method of determining the number of ECC check bits that are needed to be interleaved between the MTR coded words in the interleaving technique performed by bit-level interleaving and substitution module 304. In step 421, the value of s is calculated, where s represents the ratio of the number of ECC check bits with respect to the MTR coded words, $s=(m_2-m_1)qr_2/k$. In the above example, s=[(467−437)*10*21]/4368=1.44. In step 422, a determination is made as to whether s<1. If s<1, there are more MTR coded words than the number of ECC check bits. In that case, one ECC check bit may be inserted or stuffed in between the MTR coded words at a time (step 423). An example is shown in sequence 501 in FIG. 5. The D blocks represent MTR coded words, where each word consists of 21 bits as a result of being processed by MTR encoder 302, and the b blocks represent one ECC check bit to be interleaved between the MTR coded words. On the other hand, if s>1, then step 424 is executed. The amount of ECC check bits to be interleaved between the MTR coded words is related to s', where s' is the closest integer greater than s. In the provided example, since s=1.44, the next integer larger than s is s'=2. Therefore, 2 ECC check bits will be interleaved between the MTR coded words. There are many ways to stuff these 2 ECC check bits into the boundaries of the MTR coded words. In addition, it should be noted that in alternate embodiments, s' could be any integer larger than 2, where s' bits are inserted between the MTR coded words.

Figure 5:
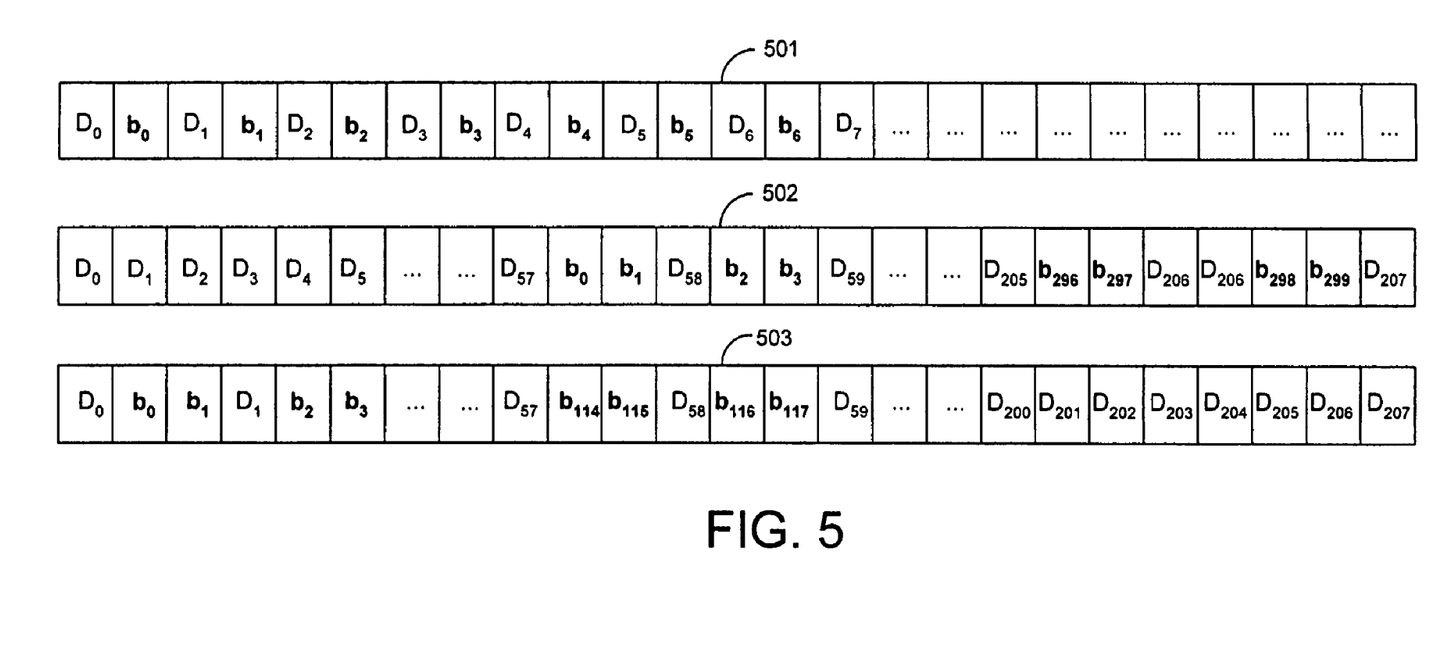
FIG. 5 illustrates encoded data having evenly distributed ECC check bits within MTR coded words.

FIG. 5 shows two examples of interleaving ECC check bits in step 424, but other ways of interleaving bits are possible. Using the example from above, there are 300 ECC check bits to be distributed, 2 ECC check bits at a time, and then interleaved into 208 MTR coded words. Sequence 502 consists first of MTR coded words $D_0$ through $D_{57}$, and then has 2 ECC check bits located between every following MTR coded word $D_{58}$ to $D_{207}$. After MTR word $D_{57}$, it should be appreciated that the ECC check bits $b_0$ to $b_{299}$ are evenly distributed within sequence 502. The importance of splitting up the ECC check symbols into ECC check bits is to minimize the possible violation of j-constraint in between MTR coded words and to ease the implementation of a Viterbi trellis. Sequence 503 shows an alternate configuration of inserting ECC check bits, where ECC check bits $b_0$ to $b_{299}$ are evenly distributed in the beginning of the sequence, and the later end of sequence 503 consists of only MTR coded words. The ECC check bits may be evenly distributed among the MTR coded words any number of ways.

Figure 6:
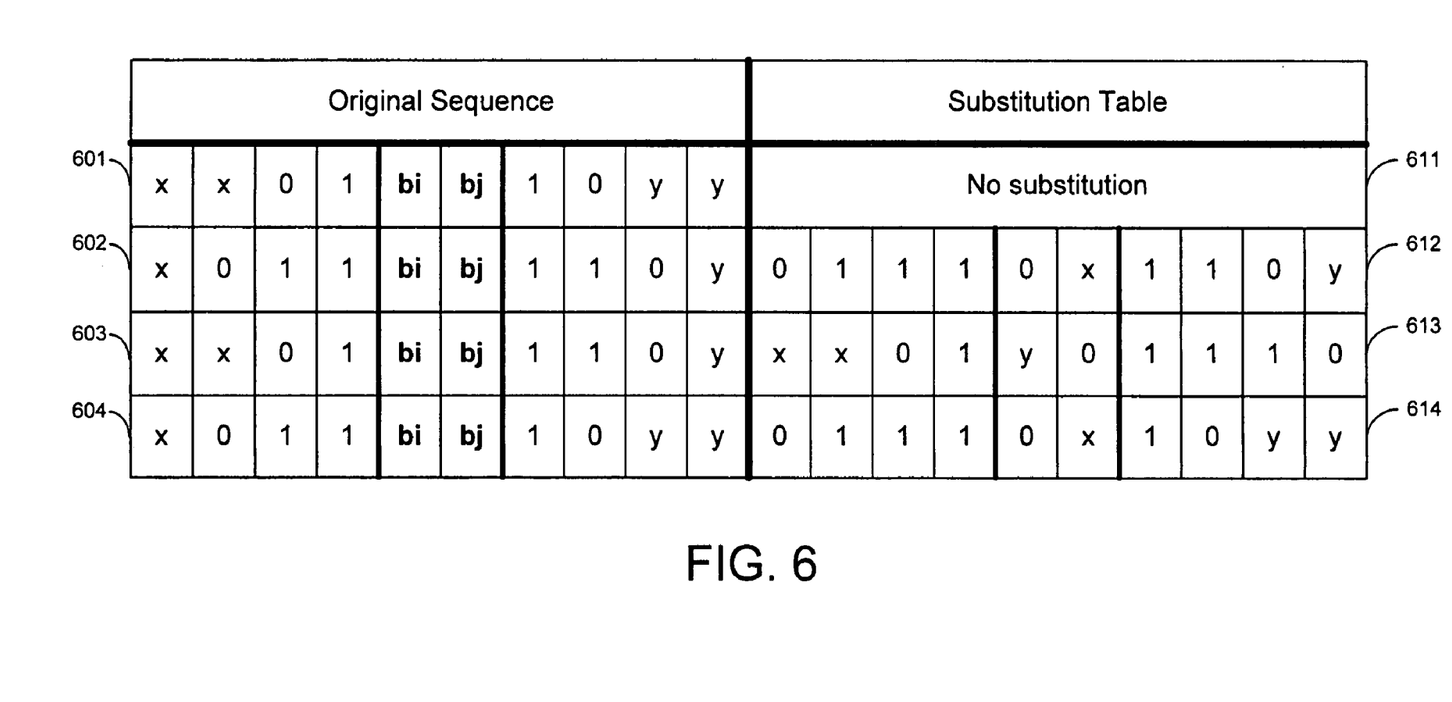
FIG. 6 illustrates a substitution table to be used if specific sequences occur according to an embodiment of the invention.

After generating a bit-level interleaved sequence in the bit-level interleaving and substitution module 304, a substitution technique may be implemented if the j-constraint is violated. A substitution table can be used to ensure that the j-constraint is satisfied. In the example of FIG. 6, the substitution table is generating based on the MTR code requirement that an MTR coded word cannot start or end with more that two 1s. Thus, a "111" sequence at the beginning or the end of an MTR coded word is not allowed in the MTR coding scheme. The substitution table employs the "111" sequence intentionally as a flag to inform the system that a substitution has taken place so that a proper conversion will occur during decoding. In other words, a property of the MTR coding is used to generate the flag indicating that a substitution has occurred.

The substitution table shown in FIG. 6 replaces sequences that violate the j-constraint with distinct sequences that satisfy the j-constraint. Sequence 601 consists of 10 bits, where the x and y bits are "don't care" bits, meaning these bits can be either 0 or 1. The first 4 bits represent the end of an MTR coded word, the bi and bj bits represent ECC check bits stuffed in between MTR coded words, and the last 4 bits represent the beginning of a neighboring MTR coded word. In the particular example in FIG. 6, the j-constraint is set so that j=4, meaning the maximum number of consecutive 1s allowed is 4. If bi and bj equal 1 in sequence 601, a string of four 1s would occur. Because the j-constraint is still satisfied, no substitution is required.

If, however, sequence 602 were to occur between two MTR coded words, there is the possibility that a string of 6 ones could occur. Sequence 602 is then substituted by sequence 612, where the j-constraint is still maintained (i.e., the sequence does not have a string which consists of more than four 1s). Sequence 612 intentionally places the sequence "111" at the end of the left MTR coded word, which acts as a flag to tell the system during the read-back process that a substitution was performed and the substitution module needs to convert this sequence back to its original sequence. In sequence 603, there is the possibility that a string of 5 consecutive ones could occur. Sequence 603 is substituted with sequence 613, where the right MTR coded word intentionally begins with the flag sequence "111." The substitution module in turn recognizes that this sequence needs to be converted back to sequence 603 during read-back. Likewise, if sequence 604 occurs, it will be substituted with sequence 614, and during the read-back process, it will be converted back to original sequence 604.

In some cases, the encoding scheme may omit the substitution process even if there is a violation of the j-constraint that may introduce some errors. The advantage of using a substitution table is the satisfaction of the j-constraint. There may be limited error propagation when reversing the substitution to obtain the original stuffing bits if errors occur at the boundaries, but it should not be a concern for practical use.

After bit-level interleaving and substitution in the module 304, the data may be processed by the precoder 305 and the parity insertion module 306. The precoder 305 translates the data into sequences of magnetic flux transitions to be recorded within a data track defined on a storage surface of a magnetic recording disk. In the parity insertion module 306, parity bits are added to the data for additional error detection. The output of the parity insertion module 306 (c bits) is sent to a channel, where the recorded data is written onto a hard disk drive.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A system for processing data, the system comprising:
    a maximum transition run or timing-varying maximum transition run (hereinafter MTR) encoder configured to encode input data sequence from a hard disk controller into an MTR coded sequence which satisfies a j-constraint;
    an error correction code (ECC) encoder configured to generate ECC check bits for the MTR coded sequence; and
    a bit-level interleaving and substitution module configured to interleave the generated ECC check bits into the MTR coded sequence by stuffing the generated ECC check bits at boundaries of MTR coded blocks of the MTR coded sequence, to determine if a violation of the j-constraint has occurred at the boundaries of the MTR coded blocks, and to perform substitution of bits at a boundary of the MTR coded blocks to maintain the j-constraint if a violation of the j-constraint has occurred at the boundary;
    wherein the j-constraint is satisfied when a long string of consecutive ones and zeros are removed.

2. The system of claim 1 wherein the bit-level interleaving and substitution module is configured to determine a number of ECC check bits to be stuffed at the boundaries of the MTR coded blocks.

3. The system of claim 2 wherein determining the number of ECC check bits to be stuffed comprises:
    calculating a ratio of the number of ECC check bits (m2−m1)q to the number of MTR coded blocks (k/r2) as s=(m2−m1)qr2/k, where k is a number of MTR encoded bits of the MTR coded sequence, r2 is an output block length of the MTR encoder, q is a symbol size of the ECC encoder, m1 is a number of information q-bit symbols, and m2 is m1/R2 in which R2 is a code rate of the ECC encoder;
    if s<1, then stuffing the ECC check bits between MTR coded blocks one bit at a time;
    if s>1 and s is an integer, then stuffing the ECC check bits between MTR coded blocks s bits at a time; and
    if s>1 and s is not an integer, then determining s' as a next integer greater than s and stuffing the ECC check bits between MTR coded blocks s' bits at a time.

4. The system of claim 1 wherein the bit-level interleaving and substitution module is configured to generate a substitution table to be used to perform substitution of bits at the boundary of the MTR coded blocks.

5. The system of claim 4 wherein the substitution table is generated to produce substitution bits that include a flag sequence of bits to indicate that a substitution has occurred based on a property of the MTR coding of the MTR encoder.

6. The system of claim 5 wherein the property of the MTR coding includes a maximum number of 1s at a boundary of the MTR coded block, and wherein the substitution bits include a flag sequence of bits exceeding the maximum of 1s at the boundary of the MTR coded block to indicate that a substitution has occurred.

7. The system of claim 1 further comprising a parity insertion module configured to add parity bits to the data sequence after processing by the bit-level interleaving and substitution module.

8. The system of claim 7 further comprising a mechanism to add pad bits if necessary to the input data sequence based on an input block length of the MTR encoder, a mechanism to add pad bits if necessary to the MTR coded sequence based on a symbol size of the ECC encoder, and a mechanism to add pad bits to the data sequence from the bit-level interleaving and substitution module if necessary based on an input block length of the parity insertion module.

9. The system of claim 7 further comprising a precoder disposed between the bit-level interleaving and substitution module and the parity insertion module to translate the data sequence from the bit-level interleaving and substitution module into transitions to be recognized by a hard disk drive.

10. The system of claim 7 further comprising:
a parity and non-parity correction module configured to perform parity and non-parity correction of data from the hard disk drive;
a bit-level de-interleaving and substitution module configured to restore the data from the parity and non-parity correction module to original sequences by reversing the substitution, and to remove and regroup the interleaved ECC check bits; and
an MTR decoder configured to decode the data from the bit-level de-interleaving and substitution module to produce decoded data to be sent to the hard disk controller.

11. An interleaving and substitution module for interleaving error correction code (ECC) check bits into a maximum transition run or timing-varying maximum transition run (hereinafter MTR) coded sequence, the interleaving and substitution module comprising:
an interleaving unit configured to interleave the ECC check bits into the MTR coded sequence by stuffing the ECC check bits at boundaries of MTR coded blocks of the MTR coded sequence;
a violation determination unit configured to determine if a violation of a j-constraint of the MTR coded sequence has occurred at the boundaries of the MTR coded blocks; and
a substitution unit configured to perform substitution of bits at a boundary of the MTR coded blocks to maintain the j-constraint if a violation of the j-constraint has occurred at the boundary.

12. The interleaving and substitution module of claim 11 wherein the interleaving unit comprising an interleaving number determination unit configured to determine a number of ECC check bits to be stuffed at the boundaries of the MTR coded blocks.

13. The interleaving and substitution module of claim 12 wherein the interleaving number determination unit is configured to
calculate a ratio of the number of ECC check bits (m2−m1)q to the number of MTR coded blocks (k/r2) as s=(m2−m1)qr2/k, where k is a number of MTR encoded bits of the MTR coded sequence, r2 is an output block length of the MTR coded sequence, q is a symbol size of the ECC check bits, m1 is a number of information q-bit symbols, and m2 is m1/R2 in which R2 is a code rate for generating the ECC check bits;
if s<, then stuff the ECC check bits between MTR coded blocks one bit at a time;
if s>1 and s is an integer, then stuff the ECC check bits between MTR coded blocks s bits at a time; and
if s>1 and s is not an integer, then determine s' as a next integer greater than s and stuff the ECC check bits between MTR coded blocks s' bits at a time.

14. The interleaving and substitution module of claim 11 wherein the substitution unit is configured to generate a substitution table to be used to perform substitution of bits at the boundary of the MTR coded blocks.

15. The interleaving and substitution module of claim 14 wherein the substitution table is generated to produce substitution bits that include a flag sequence of bits to indicate that a substitution has occurred based on a property of the MTR coding of the MTR encoder.

16. The interleaving and substitution module of claim 15 wherein the property of the MTR coding includes a maximum number of is at a boundary of the MTR coded block, and wherein the substitution bits include a flag sequence of bits exceeding the maximum of is at the boundary of the MTR coded block to indicate that a substitution has occurred.

17. A method of processing data for a hard disk controller, the method comprising:
Interleaving, via a bit-level interleaving and substitution module, error correction code (ECC) check bits into a maximum transition run or timing-varying maximum transition run (hereinafter MTR) coded sequence by stuffing the ECC check bits at boundaries of MTR coded blocks of the MTR coded sequence;
determining, via a bit-level interleaving and substitution module, if a violation of a j-constraint of the MTR coded sequence has occurred at the boundaries of the MTR coded blocks; and
performing, via a bit-level interleaving and substitution module, substitution of bits at a boundary of the MTR coded blocks to maintain the j-constraint if a violation of the j-constraint has occurred at the boundary.

18. The method of claim 17 further comprising determining a number of ECC check bits to be stuffed at the boundaries of the MTR coded blocks.

19. The method of claim 18 wherein determining the number of ECC check bits to be stuffed comprises:
calculating a ratio of the number of ECC check bits (m2−m1)q to the number of MTR coded blocks (k/r2) as s=(m2−m1)qr2/k, where k is a number of MTR encoded bits of the MTR coded sequence, r2 is an output block length of the MTR coded sequence, q is a symbol size of the ECC check bits, m1 is a number of information q-bit symbols, and m2 is m1/R2 in which R2 is a code rate for generating the ECC check bits;
if s<1, then stuffing the ECC check bits between MTR coded blocks one bit at a time;
if s>1 and s is an integer, then stuffing the ECC check bits between MTR coded blocks s bits at a time; and
if s>1 and s is not an integer, then determining s' as a next integer greater than s and stuffing the ECC check bits between MTR coded blocks s' bits at a time.

20. The method of claim 17 further comprising generating a substitution table to be used to perform substitution of bits at the boundary of the MTR coded blocks.

21. The method of claim 20 wherein the substitution table is generated to produce substitution bits that include a flag sequence of bits to indicate that a substitution has occurred based on a property of the MTR coding of the MTR encoder.

22. The method of claim 21 wherein the property of the MTR coding includes a maximum number of is at a boundary of the MTR coded block, and wherein the substitution bits include a flag sequence of bits exceeding the maximum of is at the boundary of the MTR coded block to indicate that a substitution has occurred.

23. The method of claim 17 further comprising:
encoding input data sequence from a hard disk controller into a maximum transition run (MTR) coded sequence which satisfies the j-constraint; and
generating error correction code (ECC) check bits for the MTR coded sequence.

24. The method of claim 17 further comprising adding parity bits to the data sequence.

25. The method of claim 24 further comprising:
adding pad bits if necessary to the input data sequence based on an input block length of the MTR coded sequence;
adding pad bits if necessary to the MTR coded sequence based on a symbol size of the ECC check bits; and
adding pad bits to the data sequence prior to adding the parity bits if necessary based on an input block length of a parity insertion module used to add the parity bits.

26. The method of claim 24 further comprising translating the data sequence into transitions to be recognized by a hard disk drive prior to adding the parity bits.

27. The method of claim 24 further comprising:
performing parity and non-parity correction of data from the hard disk drive;
restoring the data to original sequences by reversing the substitution, and to remove and regroup the interleaved ECC check bits; and
decoding the data to produce decoded data to be sent to the hard disk controller.

* * * * *

UNITED STATES PATENT AND TRADEMARK OFFICE
CERTIFICATE OF CORRECTION

PATENT NO. : 7,530,003 B2  
APPLICATION NO. : 11/061063  
DATED : May 5, 2009  
INVENTOR(S) : Lee et al.

Page 1 of 1

It is certified that error appears in the above-identified patent and that said Letters Patent is hereby corrected as shown below:

<u>In the Claims</u>:

Claim 13, column 11, line 64, please delete "s<" and insert -- s<1 --

Claim 16, column 12, line 15, please delete "of is" and insert -- of 1s --

Claim 19, column 12, line 45, please delete "ml" and insert -- m1 --

Claim 22, column 12, line 63, please delete "of is" and insert -- of 1s --

Claim 22, column 12, line 65, please delete "of is" and insert -- of 1s --

Signed and Sealed this

Thirtieth Day of June, 2009

JOHN DOLL  
*Acting Director of the United States Patent and Trademark Office*